(12) United States Patent
Miao

(10) Patent No.: US 8,817,167 B2
(45) Date of Patent: Aug. 26, 2014

(54) IMAGING DEVICE WITH A PLURALITY OF DEPTHS OF FIELD

(75) Inventor: Xiaoyu Miao, Sunnyvale, CA (US)

(73) Assignee: Google Inc., Mountain View, CA (US)

( * ) Notice: Subject to any disclaimer, the term of this patent is extended or adjusted under 35 U.S.C. 154(b) by 106 days.

(21) Appl. No.: 13/548,717

(22) Filed: Jul. 13, 2012

(65) Prior Publication Data

US 2014/0016015 A1 Jan. 16, 2014

(51) Int. Cl.
*H04N 5/232* (2006.01)
*H04N 3/14* (2006.01)
*H04N 5/225* (2006.01)
*H01L 31/062* (2012.01)
*H01L 31/0232* (2014.01)

(52) U.S. Cl.
USPC ........... 348/345; 348/294; 348/340; 257/294; 257/432; 257/436

(58) Field of Classification Search
None
See application file for complete search history.

(56) References Cited

U.S. PATENT DOCUMENTS

| | | | |
|---|---|---|---|
| 2004/0240052 A1* | 12/2004 | Minefuji et al. | 359/435 |
| 2007/0097249 A1* | 5/2007 | Korenaga | 348/335 |
| 2011/0141309 A1* | 6/2011 | Nagashima et al. | 348/222.1 |
| 2011/0176020 A1* | 7/2011 | Chang | 348/222.1 |
| 2012/0050562 A1* | 3/2012 | Perwass et al. | 348/222.1 |
| 2012/0104525 A1* | 5/2012 | Wu et al. | 257/432 |
| 2013/0113981 A1* | 5/2013 | Knight et al. | 348/345 |
| 2014/0049663 A1* | 2/2014 | Ng et al. | 348/222.1 |

\* cited by examiner

*Primary Examiner* — Lin Ye
*Assistant Examiner* — John H Morehead, III
(74) *Attorney, Agent, or Firm* — Blakely Sokoloff Taylor & Zafman LLP

(57) ABSTRACT

An imaging device includes an image sensor that includes a first group of pixels and a second group of pixels disposed on a semiconductor die. The first group of pixels are arranged to capture a first image and the second group of pixels are arranged to capture a second image. The imaging device also includes a first lens configured to focus image light from a first focus distance onto the first group of pixels. The imaging device further includes a second lens configured to focus the image light from a second focus distance onto the second group of pixels and not the first group of pixels. The first lens is positioned to focus the image light from the first focus distance onto the first group of pixels and not the second group of pixels. The first focus distance is different than the second focus distance.

18 Claims, 7 Drawing Sheets

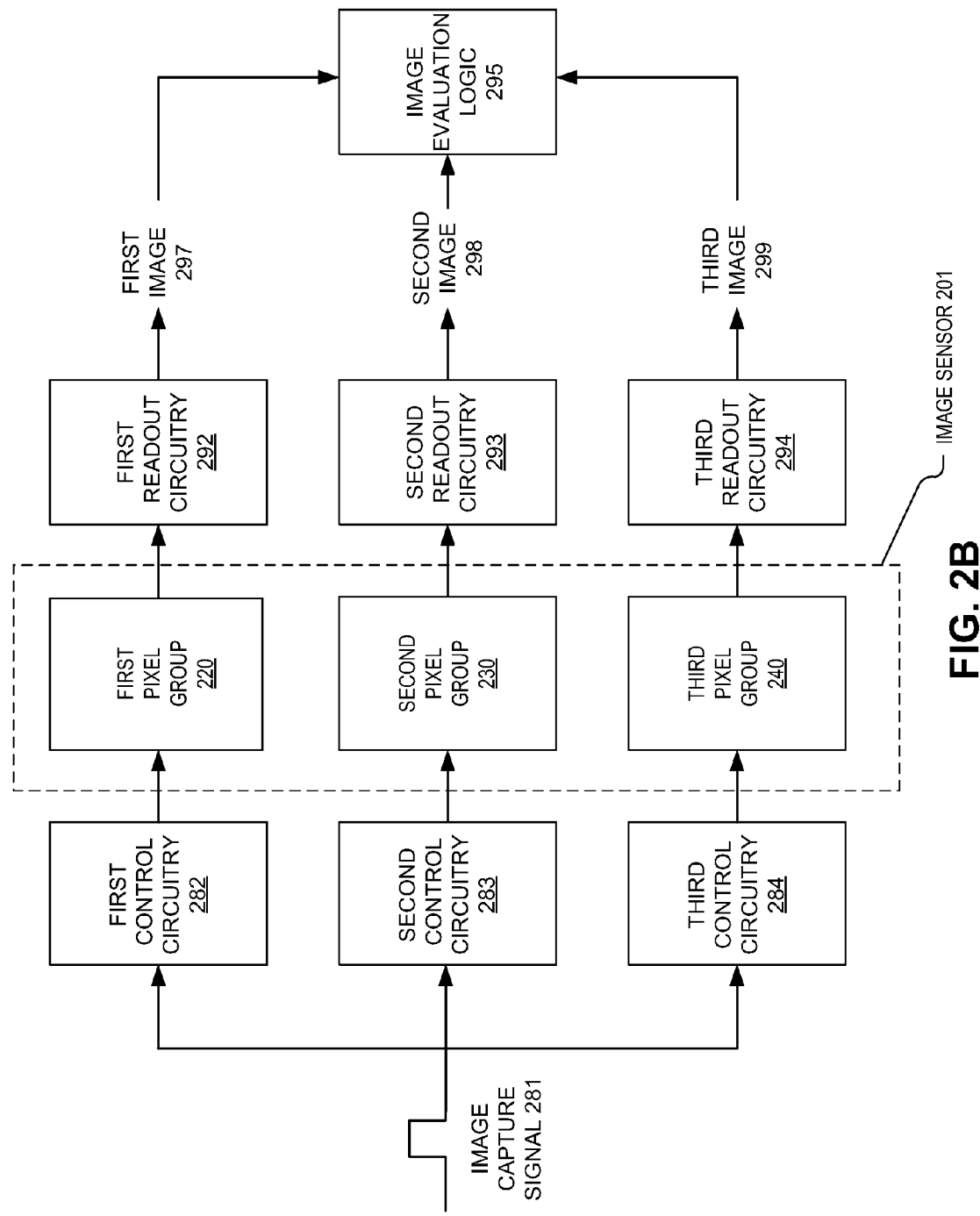

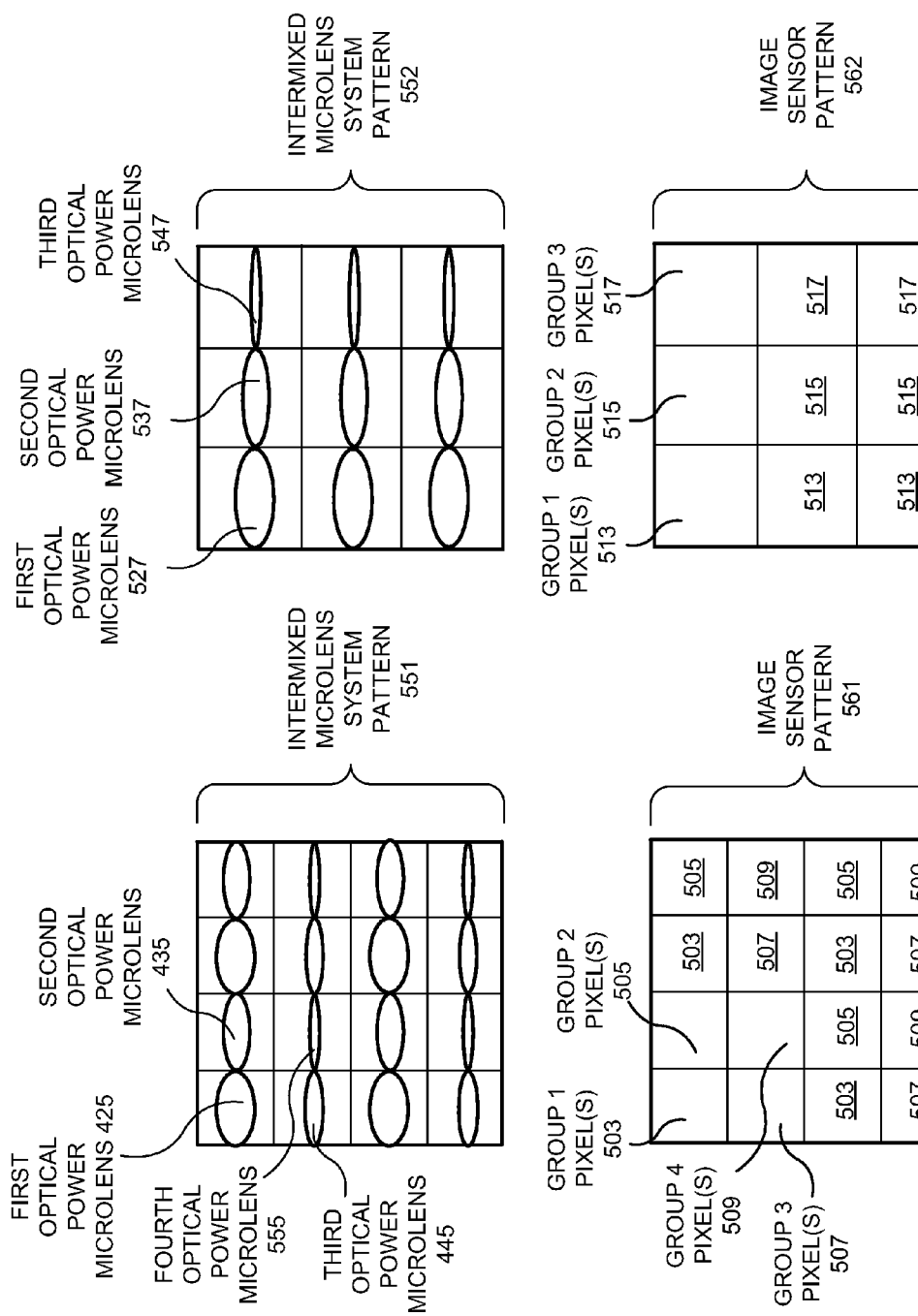

IMAGING DEVICE WITH A PLURALITY OF DEPTHS OF FIELD

TECHNICAL FIELD

This disclosure relates generally to optics, and in particular but not exclusively, relates to digital imaging devices.

BACKGROUND INFORMATION

Conventional digital imaging devices or cameras have a lens (which may include multiple lens elements) that focuses image light onto an image sensor that measures the image light and generates an image based on the measurements. FIG. 1 illustrates a common configuration for a digital imaging device 100. FIG. 1 includes an image sensor 101 and optical efficiency lenses 110 disposed over image sensor 101. Optical efficiency lenses 110 function to draw as much light as possible into the pixels for measurement. Optical efficiency lenses 110 may be microlenses disposed over each pixel of image sensor 101. An infrared ("IR") filter 115 may be disposed over optical efficiency lenses 110 and image sensor 101 to filter out IR light from being measured by image sensor 101. Lens 120 is disposed over image sensor 101 to focus image light 190 onto the pixels of image sensor 101. Lens 120 may include convex and/or concave lens elements 123 that give lens 120 a certain focal length. The focal length of lens 120 may correspond with a Depth of Field. Depth of Field refers to the range of distances in the field of view of an image sensor that appear to be well focused in an image captured by image sensor 101.

It is possible for a separation between lens 120 and image sensor 101 to be adjusted, which may result in different focus distances with different corresponding depths of field. However, digital imaging device 100 only has one depth of field in any given image because lens 120 has one focus distance at one time. For example, the foreground of an image may be in focus because it is within the depth of field for that image, but the background of the image may be blurred because it was not within the depth of field for that image. Therefore, a device or method that allows a digital imaging device to have an extended depth of field would be advantageous.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

FIG. 2B is an example block diagram of elements of a digital imaging device that may be used to simultaneously capture images with different focus distances, in accordance with an embodiment of the disclosure.

FIGS. 5B and 5C illustrate example patterns of an intermixed microlens system and example corresponding pixels patterns of the image sensor, in accordance with an embodiment of the disclosure.

DETAILED DESCRIPTION

Embodiments of a device and method for imaging at differing depths of field are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
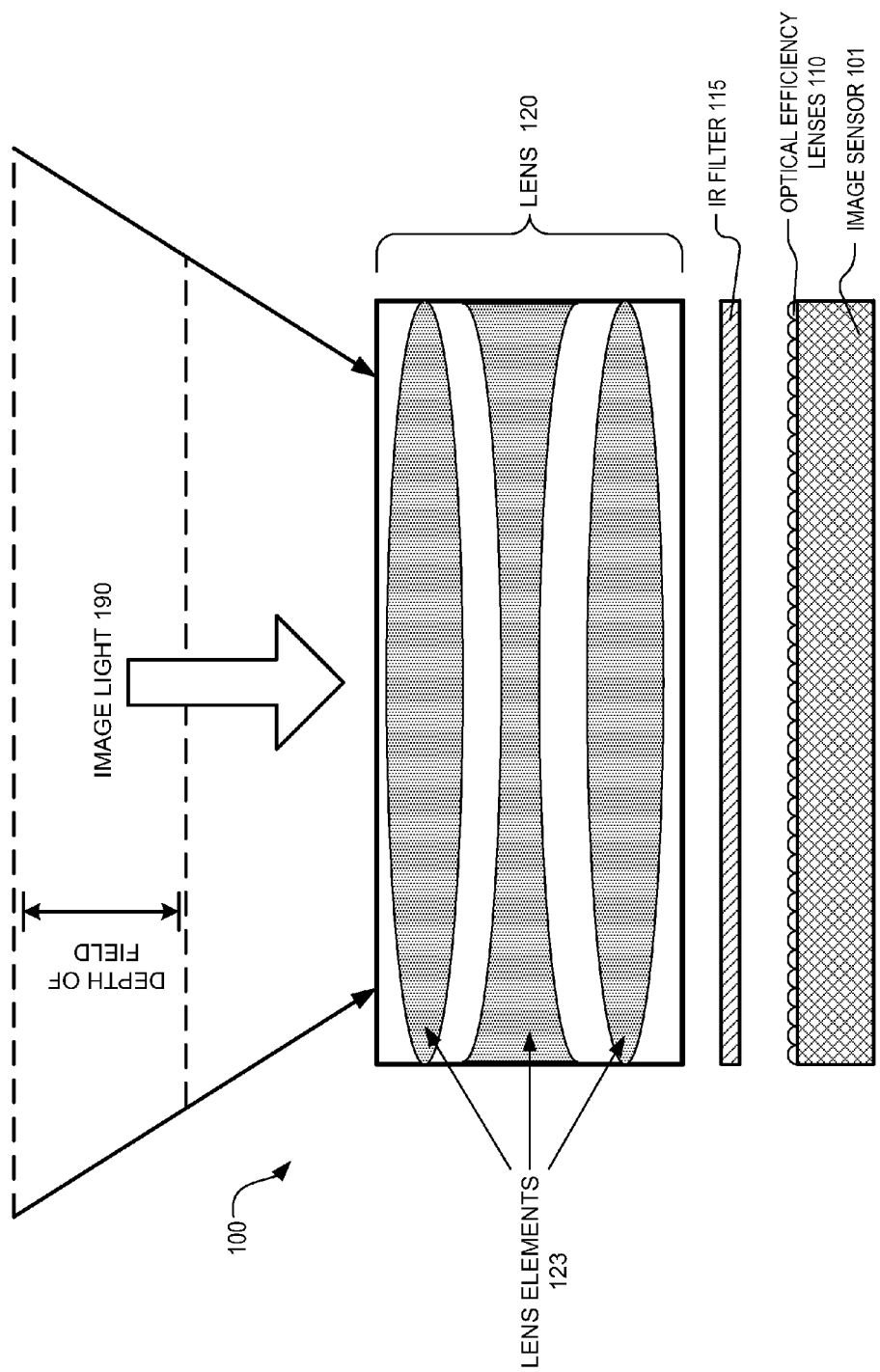
FIG. 1 is a side view of a conventional digital imaging device that includes a lens focusing image light onto an image sensor.
Figure 2A:
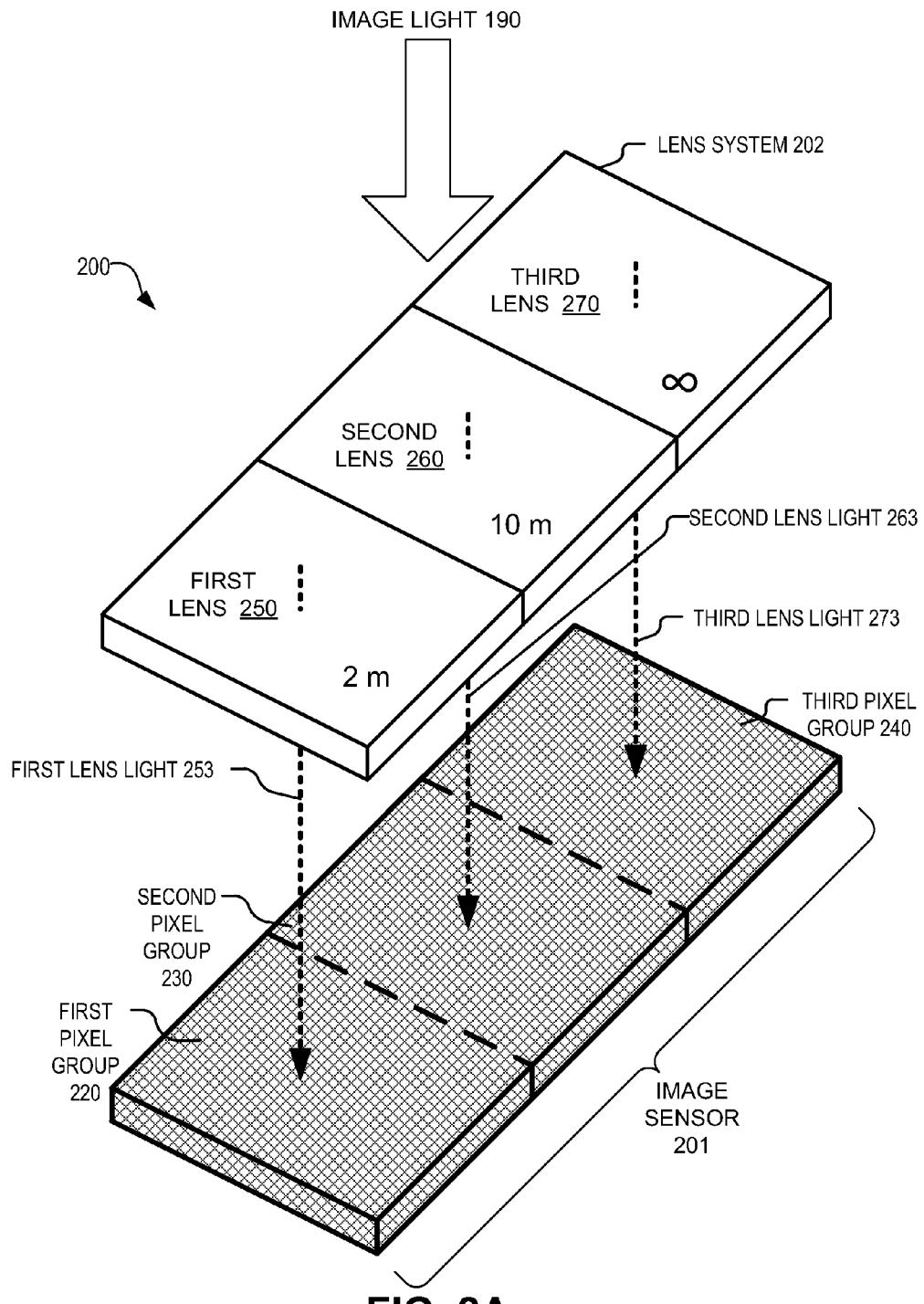
FIG. 2A illustrates an example lens system of a digital imaging device that includes different lenses focusing image light on different groups of pixels of an image sensor, in accordance with an embodiment of the disclosure.

FIG. 2A illustrates example lenses of a digital imaging device 200. Digital imaging device 200 includes image sensor 201, which includes first pixel group 220, second pixel group 230, and third pixel group 240. In the illustrated embodiment, first pixel group 220, second pixel group 230, and third pixel group 240 contain the same pixel count and are the same dimension, but configurations with differing pixel counts and differing dimensions are possible. In one embodiment, first pixel group 220, second pixel group 230, and third pixel group 240 have pixel dimensions of common image resolutions (e.g. 640×480, 1280×720, 1920×1080, etc.).

Lens system 202 includes first lens 250, second lens 260, and third lens 270. First lens 250 focuses image light 190 on first pixel group 220. First lens light 253 is the portion of image light 190 that travels through first lens 250 and is focused on first pixel group 220. Second lens light 263 is the portion of image light 190 that travels through second lens 260 and is focused on second pixel group 230. And, third lens light 273 is the portion of image light 190 that travels through third lens 270 and is focused on third pixel group 240. It is appreciated that each of first lens 250, second lens 260, and third lens 270 may include more than a single lens, which may be aligned axially.

In the illustrated embodiment, first lens 250 is configured to focus subjects approximately two meters away from image sensor 201, second lens 260 focuses subjects at approximately 10 meters, and third lens 270 focuses subjects at essentially infinity. Therefore, image sensor 201 will be able to image a scene with multiple depths of field that are centered around two meters, ten meters, and essentially infinity. In one embodiment, first lens 250 has a depth of field centered around 20 cm. First lens 250 may be configured to facilitate reading QR codes and/or bar codes. It is appreciated that digital imaging device 200 may have three different depths of field that converge or overlap. In one embodiment, first lens 250, second lens 260, and third lens 270 are substantially the same, but have a different separation distance from their respective pixel group, which provides different focus distances to the different pixel groups.

Of course, different lenses that are configured to focus at distances other than the distances specified above (e.g. 20 cm, 2 m, 10 m, infinity) are possible. In one embodiment, lens system 202 includes only two lenses that focus image light 190 on two pixel groups. In one embodiment, lens system 202 includes four lenses that focus image light 190 on four pixel groups. In the case where there are four pixel groups, image sensor 201 may be further elongated to include a fourth pixel group, or image sensor 201 may be a more conventional proportion (e.g. 4:3 or 16:9) that includes four pixel groups. If image sensor 201 is a more conventional proportion, the four pixel groups may occupy quarters of image sensor 201 with a corner of each pixel group meeting at a middle of image sensor 201. Four corresponding lenses would be disposed over the four pixel groups to focus image light 190 onto the corresponding pixel group.

In the illustrated embodiment, the pixels of the different pixel groups border or come very close to bordering pixels of other pixel groups. However, in some embodiments, pixels of the different pixel groups may be separated by some distance, instead of bordering each other.

FIG. 2B is an example block diagram of elements of a digital imaging device that may be used to simultaneously capture images with different focus distances, in accordance with an embodiment of the disclosure. In the illustrated embodiment, first pixel group 220, second pixel group 230, and third pixel group 240 are coupled to first control circuitry 282, second control circuitry 283, and third control circuitry 284, respectively. It is appreciated that, in one embodiment, first control circuitry 282, second control circuitry 283, and third control circuitry 284 may share electrical components and may be considered to be a single control circuitry module. In the illustrated embodiment, first control circuitry 282, second control circuitry 283, and third control circuitry 284 are each coupled to receive image capture signal 281. Upon receiving image capture signal 281, first control circuitry 282, second control circuitry 283, and third control circuitry 284 compel the respective pixel groups to capture an image (e.g. first image 297, second image 298, third image 299). In one embodiment, the respective pixel groups capture the images simultaneously or substantially simultaneously.

In the illustrated embodiment, first readout circuitry 292, second readout circuitry 293, and third readout circuitry 294 facilitate reading out image data from the respective pixel groups and transferring the image data along to image evaluation logic 295. It is appreciated that, in one embodiment, first readout circuitry 292, second readout circuitry 293, and third readout circuitry 294 may share electrical components and may be considered to be a single readout circuitry module. In the illustrated embodiment, first pixel group 220, second pixel group 230, and third pixel group 240 are disposed in image sensor 201 and the other circuitry is not integrated into image sensor 201. In one embodiment, image sensor 201 includes the illustrated control circuitry and readout circuitry. Image capture signal 281 may be initiated by a physical user interface (e.g. button, switch, touch-sensitive input) or initiated by a software algorithm. Image evaluation logic 295 may include a processor and memory.

Figure 3:
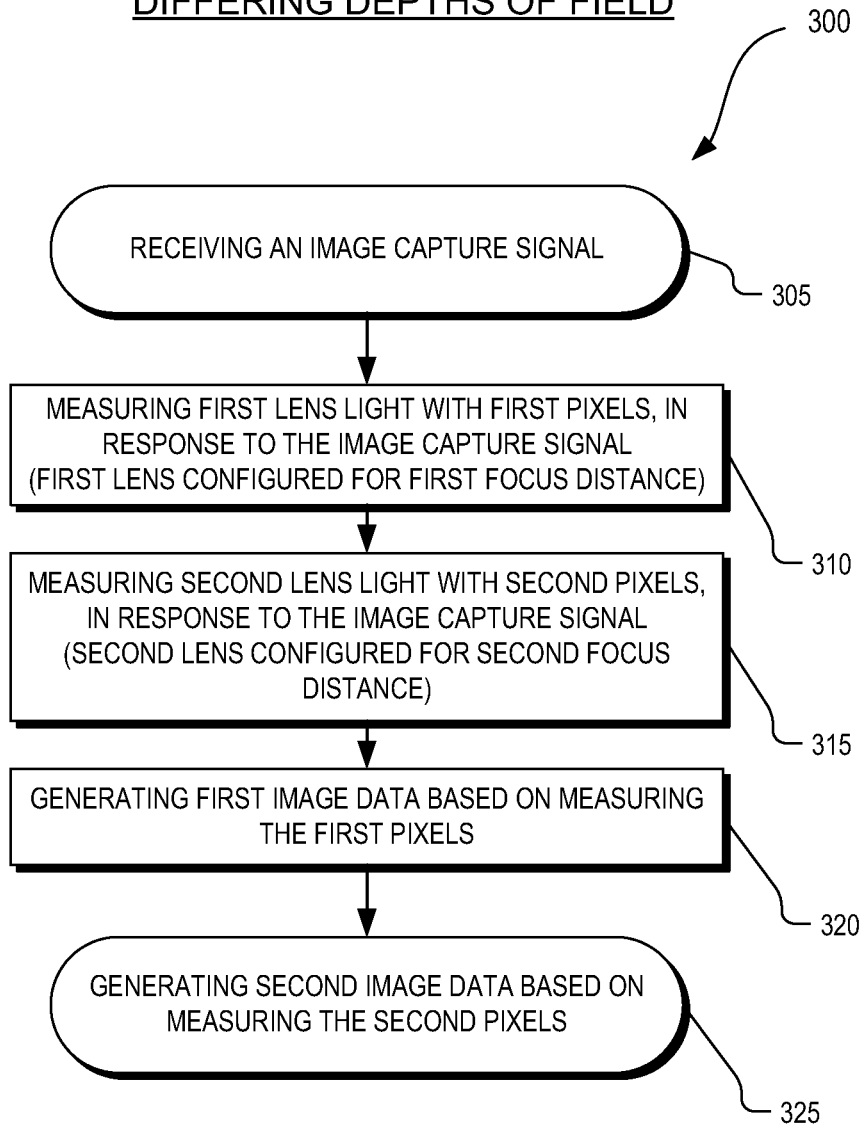
FIG. 3 is a flow chart illustrating an example process of operation of a digital imaging device for simultaneously imaging at differing depths of field, in accordance with an embodiment of the disclosure.

FIG. 3 is a flow chart illustrating an example process 300 of operation of a digital imaging device for simultaneously imaging at differing depths of field, in accordance with an embodiment of the disclosure. The order in which some or all of the process blocks appear in process 300 should not be deemed limiting. Rather, one of ordinary skill in the art having the benefit of the present disclosure will understand that some of the process blocks may be executed in a variety of orders not illustrated, or even in parallel.

In process block 305, an image capture signal (e.g. image capture signal 281) is received. In response to the image capture signal, first pixels (e.g. first pixel group 220) measure first lens light (e.g. first lens light 253) that has traveled through a first lens (e.g. first lens 250) that has a first focal length (process block 310). In process block 315, second pixels (e.g. second pixel group 230) measure second lens light (e.g. 263) in response to the image capture signal. The second lens light is light that has traveled through a second lens (e.g. second lens 260) that has a second focal length. The first lens light does not travel through the second lens and the second lens light does not travel through the first lens. The first pixels and second pixels may measure the first and second lens light contemporaneously. The first and second pixels may be disposed on the same semiconductor substrate.

In process block 320, first image data is generated based on the measurements of the first lens light by the first pixels. Second image data is generated based on the measurement of the second lens light by the second pixels (process block 325). Additional processing may be performed on the first and second image data. For example, image evaluation logic may analyze the first and second image data to determine areas of the image data that are in focus. The image evaluation logic may save in memory or discard all or parts of the first and second image data based on the analysis. In one embodiment, the image evaluation logic generates a composite image from the first and second image data. In one embodiment, the image evaluation logic selects images based on the analysis of the focus and transfers the image data to a processor for further processing. It is appreciated that process 300 can be modified from two groups of pixels and two lenses to include any number of groups of pixels and corresponding lenses. Because two or more images may be captured simultaneously with different focus distances, the image data from the two or more images can be combined in a post-processing algorithm, which may be performed in a processor. Given all of the image data (with different focus distances) collected of a scene, it is possible to construct an image that can be refocused with post-processing, after the image capture.

Power consumption savings is among the potential advantages of using process 300 with the disclosed hardware. For example, initiating an image capture sequence can consume significant amounts of power, especially in the mobile device context. Therefore, being able to capture images that have different focus distances (with a plurality of depths of field) with one image capture sequence may save power over initiating two image capture sequences in order to generate images that have different focus points. This may be especially true if a flash device (e.g. power light emitting diode "LED") is used to assist in capturing the images.

Another potential advantage of using process 300 with the disclosed hardware is reducing latency. In a conventional imaging device, two image captures (with a time delay between the two image captures) must be initiated to capture images with different focus distances. This time difference may be problematic especially if objects in the scene are moving. In process 300, the first pixels and the second pixels may capture the image light simultaneously or contemporaneously, which reduces or eliminates latency associated with two images with different focus distances. Hence, the two or more images (with different focus distances) captured using process 300 are more likely to be representative of the same scene because the two or more images are captured at the same or substantially the same time. Of course, process 300 could incorporate additional lenses (e.g. third lens 270) and pixels (e.g. third pixel group 240).

Figure 4:
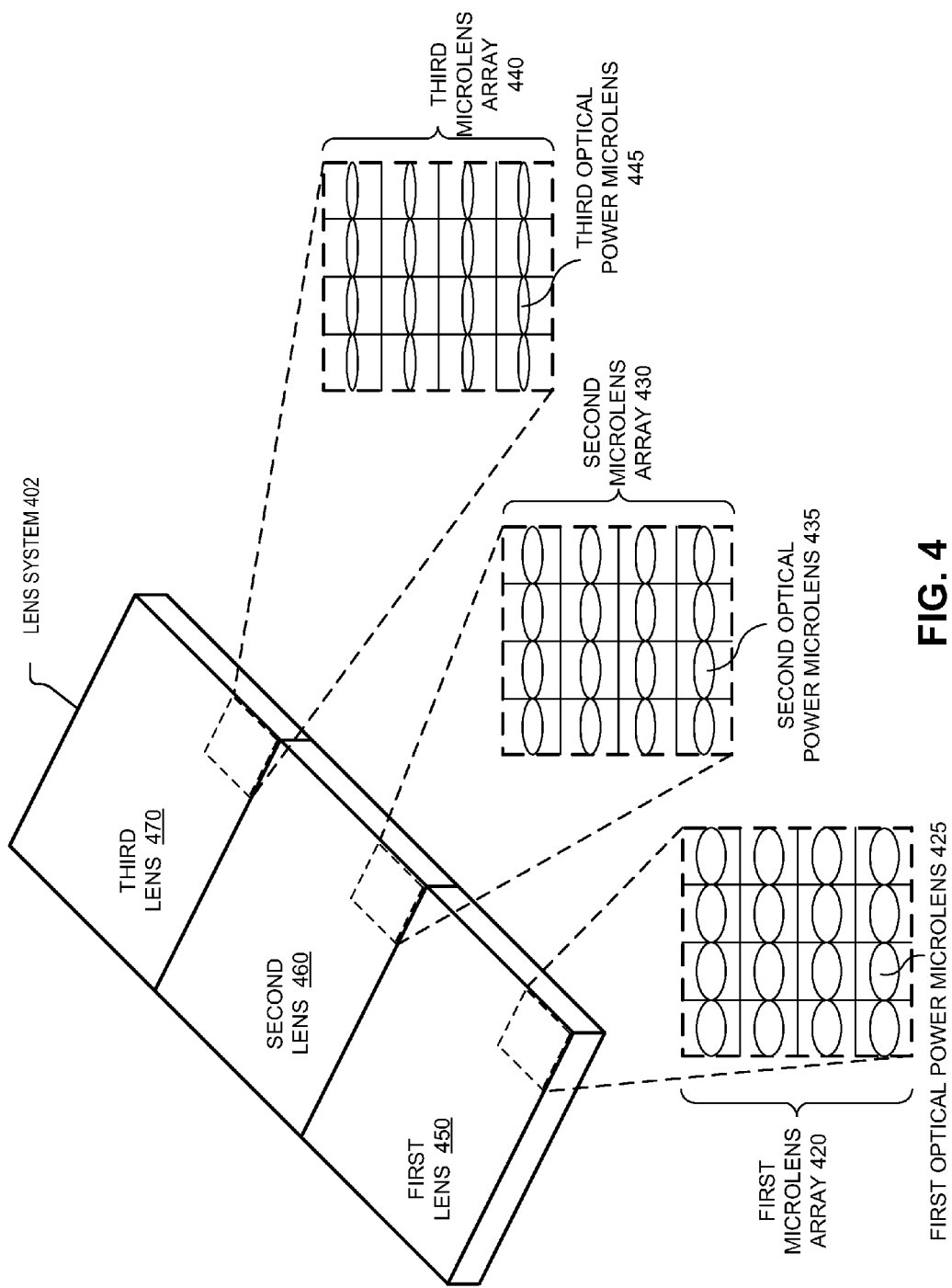
FIG. 4 is a perspective view of one example of a lens system that include microlens arrays, in accordance with an embodiment of the disclosure.

FIG. 4 is a perspective view of one example of lenses that include microlens arrays, in accordance with an embodiment of the disclosure. FIG. 4 illustrates lens system 402 which includes first lens 450, second lens 460, and third lens 470. Lens system 402 may be used in place of lens system 202. First lens 450 includes first microlens array 420. First microlens array 420 includes first optical power microlenses 425. Second lens 460 and third lens 470 include second microlens array 430 and third microlens array 440, respectively. Second microlens array 430 includes second optical power microlenses 435. Third microlens array 440 includes third optical power microlenses 445. In the illustrated embodiment, the first, second, and third microlenses each have different optical powers, which gives the first, second, and third pixel groups different focus distances. The lenses with the microlens arrays may be made using an injection molding process.

Each microlens in the respective arrays may focus image light 190 onto a group of pixels. For example, first optical power microlens 425 may focus image light 190 onto four pixels among first pixel group 220. It is appreciated that the microlens arrays in FIG. 4 may be in addition to any optical efficiency microlenses (e.g. optical efficiency lenses 110) that are disposed on image sensor 201. And, digital imaging device 200 may include more or less lens elements than just the illustrated microlenses in lens system 402.

Figure 5A:
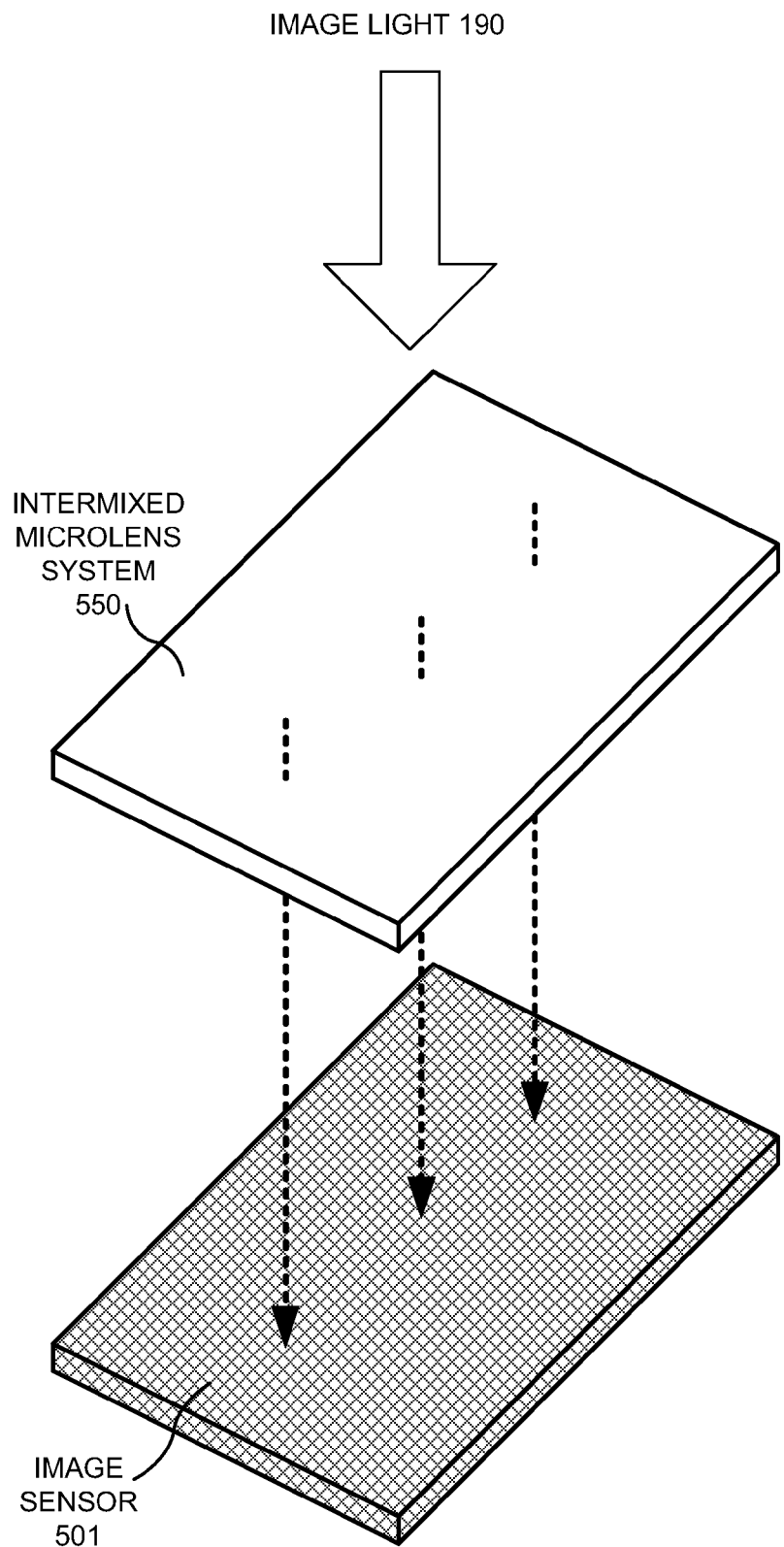
FIG. 5A is a perspective view of an example intermixed microlens system that focuses image light onto a corresponding image sensor, in accordance with an embodiment of the disclosure.

FIGS. 5A-5C illustrate examples of an intermixed microlens system and corresponding image sensor configurations, in accordance with an embodiment of the disclosure. FIG. 5A illustrates an example intermixed microlens system 550 focusing image light 190 onto corresponding image sensor 501. Intermixed microlens system 550 includes microlenses with different focal lengths intermixed in a pattern. Corresponding image sensor 501 includes pixels that are arranged to correspond with the microlens pattern.

FIGS. 5B and 5C illustrate example patterns of intermixed microlens system 550 and example corresponding pixels patterns of image sensor 501, in accordance with an embodiment of the disclosure. Intermixed microlens system pattern 551 includes first optical power microlens 425, second optical power microlens 435, third optical power microlens 445, and fourth optical power microlens 555 arranged in a pattern. The illustrated example of intermixed microlens system pattern 551 includes four of each of the first, second, third, and fourth optical power microlenses arranged in four instances of a repeating pattern that includes one of each of the microlenses.

Image sensor pattern 561 shows how image sensor 501 would be arranged to correspond with intermixed microlens system pattern 551. Image sensor pattern 561 includes group-1 pixel(s) 503, group-2 pixel(s) 505, group-3 pixel(s) 507, and group-4 pixel(s) 509. When assembled, first optical power microlens 425 is disposed over group-1 pixel(s) 503 to focus image light onto group-1 pixel(s) 503. Similarly, second optical power microlens 435 is disposed over group-2 pixel(s) 505, third optical power microlens 445 is disposed over group-3 pixel(s) 507, and fourth optical power microlens 555 is disposed over group-4 pixel(s) 509. Group-1 pixel(s) 503 may be a single pixel or may include a plurality of pixels in group-1. In one embodiment, each first optical power microlens 425 focuses image light on a corresponding pixel in group-1. In this case, the relationship between microlens and pixel may be referred to as a one-to-one correspondence. In one embodiment, first optical power microlens 425 focuses image light on a plurality of corresponding pixels in group-1. The second, third, and fourth microlenses may have similar relationships to group-2, 3, and 4 pixels. In one embodiment, first optical power microlens 425 has a one-to-one correspondence with a group-1 pixel 503, while second optical power microlens 435 does not have a one-to-one correspondence with group-2 pixels 505.

Intermixed microlens system pattern 552 includes first optical power microlens 527, second optical power microlens 537, and third optical power microlens 547. The illustrated example of intermixed microlens system pattern 552 includes three of each of the first, second, and third optical power microlenses arranged in three columns. The first, second, and third columns are populated with first, second, and third optical power microlenses 527, 537, and 547, respectively. It is appreciated that these columns may be repeated across intermixed lens system 550 and that the columns may be oriented as rows of microlenses rather than columns.

Image sensor pattern 562 shows how image sensor 501 would be arranged to correspond with intermixed microlens system pattern 552. Image sensor pattern 562 includes group-1 pixel(s) 513, group-2 pixel(s) 515, and group-3 pixel(s) 517. When assembled, first optical power microlens 527 is disposed over group-1 pixel(s) 513 to focus image light onto group-1 pixel(s) 513. Similarly, second optical power microlens 537 is disposed over group-2 pixel(s) 515 and third optical power microlens 547 is disposed over group-3 pixel(s) 517. Group-1 pixel(s) 513 may be a single pixel or may include a plurality of pixels in group-1. In one embodiment, the first optical power microlens 427 has a one-to-one correspondence with a group-1 pixel 513, while second optical power microlens 437 does not have a one-to-one correspondence with group-2 pixels 515.

Intermixed microlens system pattern 551 and 552 are example patterns and other patterns for intermixed microlens system 550 are possible. It is appreciated that the image sensor pattern will change to correspond with the patterns for intermixed microlens system 550.

Capturing images with substantially the same perspective may be one potential advantage of using intermixed microlens system 550 with corresponding image sensor 501. For example, if first pixels in group-1 generate a first image, second pixels in group-2 generate a second image, and third pixels in group-3 generate a third image, those images will share almost the same perspective because of the close proximity (e.g. side by side) of the first, second, and third pixels. In image sensor pattern 561, for example, the group-1, group-2, and group-3 are in closer proximity to each other than pixels in first pixel group 220, second pixel group 230, and third pixel group 240. The substantially the same perspective offered by intermixed lens system 550 and corresponding image sensor 501 may be especially useful for images captured at close range (e.g. less than 30 cm focus distance).

In some embodiments of the disclosure, software correction may be applied to images generated by the different pixel groups. For example, software correction may be used if group-1 pixel 503 receive second lens light from second optical power microlens 435 that is intended to be focused on group-2 pixel 505, and vice versa. This occurrence may be referred to as optical crosstalk or light pollution. The optical crosstalk may be accounted for by calibrating the image sensor (e.g. image sensor 501) and the intermixed microlens system (e.g. intermixed microlens system 550) in a known environment. Based on the calibration, a software correction may be applied to the image data generated by the pixels, in order to compensate for unintended optical crosstalk between pixels.

The processes explained above are described in terms of computer software and hardware. The techniques described may constitute machine-executable instructions embodied within a tangible or non-transitory machine (e.g., computer) readable storage medium, that when executed by a machine will cause the machine to perform the operations described. Additionally, the processes may be embodied within hardware, such as an application specific integrated circuit ("ASIC") or otherwise.

A tangible non-transitory machine-readable storage medium includes any mechanism that provides (i.e., stores) information in a form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An imaging device comprising:
   an image sensor including:
      a first group of pixels disposed on a semiconductor die and arranged to capture a first image;
      a second group of pixels disposed on the semiconductor die and arranged to capture a second image;
   a first lens that includes a first array of microlenses having a first focal length, wherein the first array of microlenses is configured to focus image light from a first focus distance onto the first group of pixels; and
   a second lens that includes a second array of microlenses having a second focal length different from the first focal length, wherein the second array of microlenses is configured to focus the image light from a second focus distance onto the second group of pixels and not the first group of pixels, and wherein the first lens is positioned to focus the image light from the first focus distance onto the first group of pixels and not the second group of pixels, the first focus distance being different than the second focus distance,
   and further wherein first microlenses of the first array of microlenses are intermixed with second microlenses of the second array of microlenses in a repeating pattern and the first group of pixels is intermixed with the second group of pixels to correspond with the first and second microlenses intermixed in the repeating pattern.

2. The imaging device of claim 1, further comprising pixel control circuitry coupled to the first group of pixels and the second group of pixels and coupled to receive a same image capture signal, wherein the first and second groups of pixels are configured to capture image data in response to the same image capture signal.

3. The imaging device of claim 1, wherein the repeating pattern includes the first microlenses uniformly distributed amongst the second microlenses.

4. The imaging device of claim 1, wherein each of the first microlenses focuses the image light on at least two pixels of the first group of pixels, and wherein each of the second microlenses focuses the image light on at least two pixels of the second group of pixels.

5. The imaging device of claim 2, wherein the image sensor includes a third group of pixels arranged to capture a third image and disposed on the semiconductor die and the imaging device further comprises:
   a third lens that includes a third array of microlenses having a third focal length, wherein the third array of microlenses is configured to focus the image light from a third focus distance onto the third group of pixels, wherein the third group of pixels is coupled to capture the image data in response to the same image capture signal, and wherein the third focus distance is different than the first and second focus distance.

6. The imaging device of claim 5, wherein the first microlenses are arranged in a first column, the second microlenses are arranged in a second column, and the third microlenses are arranged in a third column.

7. The imaging device of claim 1, wherein the first lens provides a depth of field of infinity.

8. The imaging device of claim 1, further comprising:
   image evaluation logic coupled to receive first image data generated by the first group of pixels and coupled to receive second image data generated by the second group of pixels; and
   memory to store the first image data and second image data.

9. A method of simultaneously imaging a scene at differing depths of field, the method comprising:
   receiving an image capture signal;
   measuring, in response to the image capture signal, first lens light with first pixels disposed on a semiconductor die, wherein the first lens light travels through a first lens that includes a first array of microlenses having a first focal length, and wherein the first array of microlenses is configured to focus the first lens light from a first focus distance onto the first pixels;
   measuring, in response to the image capture signal, second lens light with second pixels disposed on the semiconductor die, wherein the second lens light travels through a second lens that includes a second array of microlenses having a second focal length, wherein the second array of microlenses is configured to focus the second lens light from a second focus distance onto the second pixels, and wherein the first lens light does not travel through the second lens and the second lens light does not travel through the first lens;
   generating first image data based on measuring the first lens light with the first pixels; and
   generating second image data based on measuring the second lens light with the second pixels, wherein the first focus distance is different than the second focus distance, and wherein first microlenses of the first array of microlenses are intermixed with second microlenses of the second array of microlenses in a repeating pattern and the first pixels are intermixed with the second pixels to correspond with the first and second microlenses intermixed in the repeating pattern.

10. The method of claim 9 further comprising:
   measuring, in response to the image capture signal, third lens light with third pixels disposed on the semiconductor die, wherein the third lens light travels through a third lens that includes a third array of microlenses having a third focal length, wherein the third array of microlenses is configured to focus the third lens light from a third focus distance onto the third pixels, and wherein the third lens light does not travel through the first or second lens and the first and second lens light does not travel through the third lens; and generating third image data based on measuring the third lens light with the third pixels.

11. The method of claim 10, wherein the first microlenses of the first lens are arranged in a first column, the second microlenses of the second lens are arranged in a second column, and the third microlenses of the third lens are arranged in a third column.

12. The method of claim 9 further comprising:
analyzing focus areas of the first image data and the second image data.

13. The method of claim 12 further comprising:
generating a composite image based on the focus areas of the first image data and the second image data.

14. The method of claim 12 further comprising:
selecting image data based on the focus areas for further processing.

15. At least one non-transitory machine-accessible storage medium that provides instructions that, when executed by an imaging device, will cause the imaging device to perform operations comprising:

receiving an image capture signal;

measuring, in response to the image capture signal, first lens light with first pixels disposed on a semiconductor die, wherein the first lens light travels through a first lens that includes a first array of microlenses having a first focal length, and wherein the first array of microlenses is configured to focus the first lens light from a first focus distance onto the first pixels;

measuring, in response to the image capture signal, second lens light with second pixels disposed on the semiconductor die, wherein the second lens light travels through a second lens that includes a second array of microlenses having a second focal length, wherein the second array of microlenses is configured to focus the second lens light from a second focus distance onto the second pixels, and wherein the first lens light does not travel through the second lens and the second lens light does not travel through the first lens;

generating first image data based on measuring the first lens light with the first pixels; and generating second image data based on measuring the second lens light with the second pixels, wherein the first focus distance is different than the second focus distance, and wherein first microlenses of the first array of microlenses are intermixed with second microlenses of the second array of microlenses in a repeating pattern and the first pixels are intermixed with the second pixels to correspond with the first and second microlenses intermixed in the repeating pattern.

16. The at least one non-transitory machine-accessible storage medium of claim 15, further providing instructions that, when executed by the imaging device, will cause the imaging device to perform further operations, comprising:

measuring, in response to the image capture signal, third lens light with third pixels disposed on the semiconductor die, wherein the third lens light travels through a third lens that includes a third array of microlenses having a third focal length, wherein the third array of microlenses is configured to focus the third lens light from a third focus distance onto the third pixels, and wherein the third lens light does not travel through the first or second lens and the first and second lens light does not travel through the third lens; and generating third image data based on measuring the third lens light with the third pixels.

17. The at least one non-transitory machine-accessible storage medium of claim 16, wherein the first microlenses of the first lens are arranged in a first column, the second microlenses of the second lens are arranged in a second column, and the third microlenses of the third lens are arranged in a third column.

18. The at least one non-transitory machine-accessible storage medium of claim 15, wherein a first distance between the first pixels and the first microlenses is substantially equal to the first focal length, and wherein a second distance between the second pixels and the second microlenses is substantially equal to the second focal length.

* * * * *